United States Patent
Goyal et al.

(10) Patent No.: US 12,483,265 B2
(45) Date of Patent: Nov. 25, 2025

(54) RDAC LADDER WITH ADAPTIVE BIASING TO REDUCE THE REFERENCE VARIATION ACROSS TEMPERATURE

(71) Applicant: NXP USA, Inc., Austin, TX (US)

(72) Inventors: Saurabh Goyal, Sonipat (IN); Krishna Thakur, Uttar Pradesh (IN); Divya Tripathi, Uttar Pradesh (IN); Deependra Kumar Jain, Uttar Pradesh (IN)

(73) Assignee: NXP USA, Inc., Austin, TX (US)

( * ) Notice: Subject to any disclaimer, the term of this patent is extended or adjusted under 35 U.S.C. 154(b) by 273 days.

(21) Appl. No.: 18/315,652

(22) Filed: May 11, 2023

(65) Prior Publication Data
US 2024/0178858 A1    May 30, 2024

(30) Foreign Application Priority Data
Nov. 29, 2022   (IN) .............................. 202211068719

(51) Int. Cl.
*H03M 1/00*   (2006.01)
*H03M 1/78*   (2006.01)

(52) U.S. Cl.
CPC .................................. *H03M 1/785* (2013.01)

(58) Field of Classification Search
CPC ................................ H03M 1/785; H03M 1/66
USPC ................................ 341/155, 156, 172, 154
See application file for complete search history.

(56) References Cited

U.S. PATENT DOCUMENTS

| | | | | |
|---|---|---|---|---|
| 5,079,552 A | * | 1/1992 | Pelgrom | H03M 1/0602 |
| | | | | 341/144 |
| 6,781,536 B1 | * | 8/2004 | Martins | H03M 1/682 |
| | | | | 341/154 |
| 7,372,387 B2 | * | 5/2008 | Li | H03M 1/765 |
| | | | | 341/145 |
| 8,111,094 B2 | | 2/2012 | Fischer | |
| 8,618,971 B1 | | 12/2013 | Li | |
| 9,077,376 B2 | | 7/2015 | Dempsey | |

(Continued)

FOREIGN PATENT DOCUMENTS

| | | | |
|---|---|---|---|
| EP | 2782256 | * | 9/2014 |
| WO | WO-2020155015 A1 | | 8/2020 |

OTHER PUBLICATIONS

Chun-Yueh Yang et al., A Low-Voltage Low-Distortion MOS Sampling Switch, 2005 IEEE International Symposium on Circuits and Systems (ISCAS), May 23-26, 2005, DOI: 10.1109/ISCAS.2005.1465291, Kobe, Japan, pp. 3131-3134.

(Continued)

Primary Examiner — Peguy Jean Pierre

(57) ABSTRACT

A low current, adaptively-biased switched resistor digital-to-analog converter (RDAC) circuit, method and apparatus are provided with a coarse trim ladder and a fine trim ladder connected with a plurality of NFET switches to generate an output reference voltage from an input supply voltage, where the bulk semiconductor substrate regions for the NFET switches in at least the fine trim ladder are driven by a unity gain buffer which is connected in feedback to receive the output reference voltage and to generate a buffered reference voltage which is directly connected to bulk semiconductor regions of the NFET switches, thereby providing a low current, low circuit area solution with reduced leakage current and temperature variation.

19 Claims, 4 Drawing Sheets

(56) References Cited

U.S. PATENT DOCUMENTS

| | | |
|---|---|---|
| 9,576,679 B2 | 2/2017 | Powell et al. |
| 9,584,118 B1 | 2/2017 | Dao et al. |
| 9,941,894 B1 | 4/2018 | Gu et al. |
| 10,497,455 B2 | 12/2019 | Elsayed |
| 10,917,090 B1 | 2/2021 | Agarwal et al. |
| 2008/0055135 A1* | 3/2008 | Li ........................ H03M 1/765 341/144 |
| 2020/0091928 A1 | 3/2020 | Wang et al. |

OTHER PUBLICATIONS

Rahul Kumar, Design of Two Stage CMOS Operational Amplifier, International Journal of Science and Research (IJSR), vol. 10, Issue 6, Jun. 2021, paper ID SR21622171146, pp. 1505-1508.

\* cited by examiner

RDAC LADDER WITH ADAPTIVE BIASING TO REDUCE THE REFERENCE VARIATION ACROSS TEMPERATURE

CROSS-REFERENCE TO RELATED APPLICATIONS

This application claims the priority under 35 U.S.C. § 119 of India application No. 202211068719, filed on 29 Nov. 2022, the contents of which are incorporated by reference herein.

BACKGROUND OF THE INVENTION

Field of the Invention

The present invention is directed in general to electronic circuits. In one aspect, the present invention relates to integrated circuit digital-to-analog converters for generating a reference voltage with adaptively biased switches.

Description of the Related Art

Resistive digital-to-analog converters (RDAC) are suitable for implementation in modern integrated circuit (IC) processes, but the linearity performance can be degraded due to variation of leakage currents. This dependency is inherent in the architecture of the RDAC since the input code controls the resistances connected between the supply node and the ground node of the RDAC. In addition, diode leakages are created when the RDAC is formed with MOSFET switches having semiconductor bulk substrate which are connected to ground. These design factors cause the resistance between the reference and ground node to vary, thereby resulting in variations in the current through the RDAC. As a result, the output reference voltage generated by the RDAC can vary with temperature. As seen from the foregoing, the performance of RDAC circuits can vary across process, supply voltage and temperature (PVT) parameters which causes the frequency of a system, such as a free running oscillator which uses the RDAC, to vary significantly, thereby affecting the system performance. While RDAC designs have been proposed for reducing leakage current and improving reference variation across temperature, such solutions require large circuit areas (in the form of additional isolated p-well rings) or introduce additional diode leakage problems in the circuit, resulting in increased temperature variation. As a result, the existing RDAC solutions for accurately generating output reference voltage signals with reduced temperature variation are extremely difficult at a practical level.

BRIEF DESCRIPTION OF THE DRAWINGS

The present invention may be understood, and its numerous objects, features and advantages obtained, when the following detailed description is considered in conjunction with the following drawings.

DETAILED DESCRIPTION

Figures 1, 2:
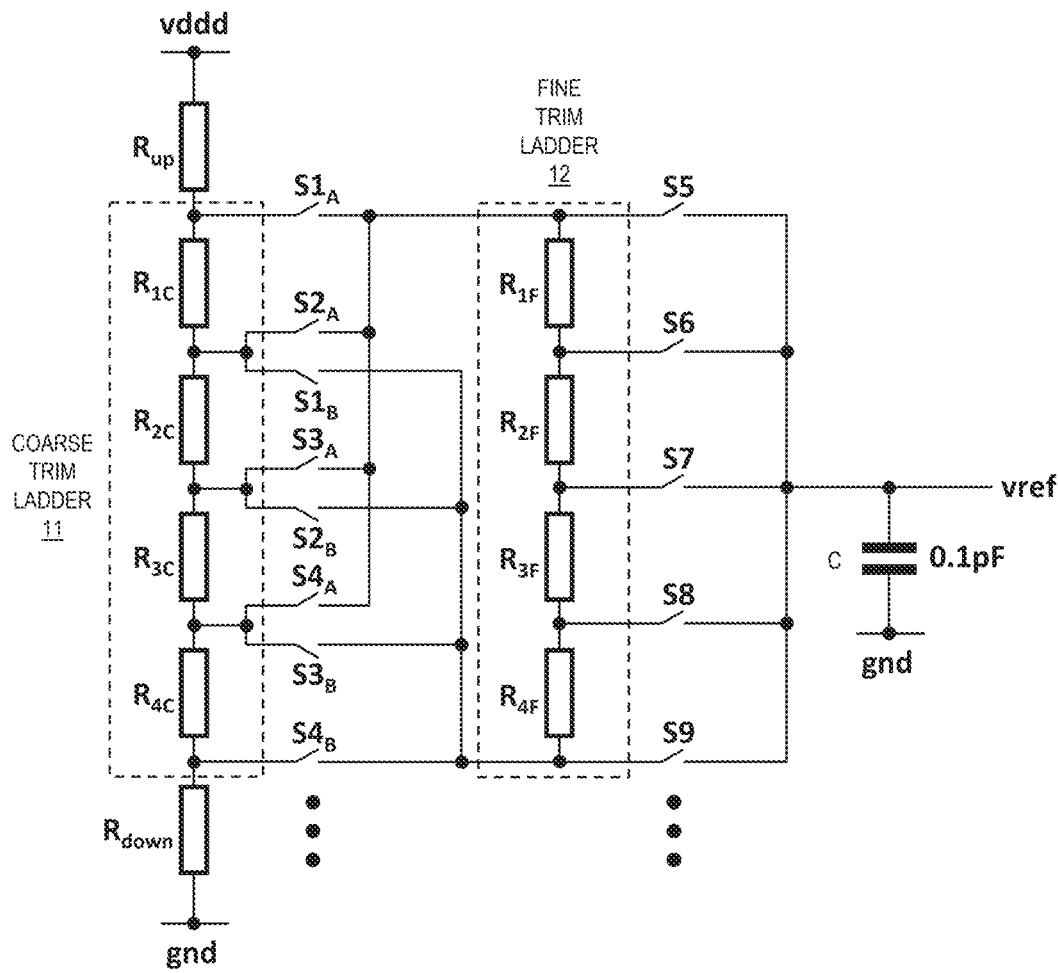
FIG. 1 is a schematic circuit diagram of a dual resistor ladder DAC which includes a coarse trim ladder and fine trim ladder.
FIG. 2 is a simplified block diagram of a reference voltage trim decoder for generating switch controls for dual resistor ladder DAC having a coarse trim ladder and fine trim ladder.

A switched resistor digital-to-analog converter (RDAC) circuit, apparatus, and method of operation are described for use with applications for generating output reference voltages with adaptive body biasing to reduce temperature variation. As disclosed, a dual resistor ladder DAC circuit includes a coarse trim ladder and a fine trim ladder connected with a plurality of NFET switches to generate an output reference voltage from an input supply voltage, where the bulk semiconductor substrate regions for the NFET switches in at least the fine trim ladder are driven by a unity gain buffer which is connected in feedback to receive the output reference voltage, thereby providing a low current, low circuit area solution with reduced leakage current and temperature variation. In selected embodiments, the disclosed switched RDAC achieves fine trim resolution of 90 µV and uses unity gain buffer to provide adaptive biasing to reduce temperature variation across temperature. For example, the disclosed switched RDAC may achieve temperature variation of 40-44 µV over a specified temperature range, significant improvement over conventional solutions which have larger temperature variation (e.g., 324 µV). While the disclosed switched RDAC can be included in free running oscillator (FRO) circuits which generate clock signals with less than 0.1% variation, it can be used in any RDAC ladder in any circuit block requiring a stable reference voltage, and is independent of technology as well.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure.

For example, selected aspects are depicted with reference to simplified block diagrams and schematic circuit block diagrams without including every circuit element or detail in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to illustrate specific details. Furthermore, the described features, advantages, and characteristics of the invention may be combined in any suitable manner in one or more embodiments. One skilled in the relevant art will recognize, in light of the description herein, that the embodiments can be practiced without one or more of the specific features or advantages of a particular embodiment. In other instances, additional features and advantages may be recognized in certain embodiments that may not be present in all embodiments. For example, selected aspects are depicted with reference to simplified circuit schematic drawings without including every circuit detail in order to avoid limiting or obscuring the present invention. Such details are well known and not considered necessary to teach one skilled in the art of how to make or use the present invention.

To provide additional details for a contextual understanding of the present disclosure, reference is now made to FIG. 1 which shows a schematic circuit diagram of a dual resistor ladder DAC 10 which includes a coarse trim ladder 11 and fine trim ladder 12 connected with a plurality of switches to receive an input supply voltage Vddd and to generate an output reference voltage Vref across an output capacitor C that is connected to ground. As depicted, the coarse trim ladder 11 includes a plurality of coarse ladder resistors connected in series between a supply voltage Vddd and ground, including an upper resistor $R_{UP}$, a plurality of coarse ladder resistors $R_{1C}$-$R_{4C}$, and a down resistor $R_{DOWN}$. With the up and down resistors $R_{UP}$, $R_{DOWN}$, the trim range for the output reference voltage Vref may be set to a specified range of values (e.g., 150 mV≤Vref≤500 mV). In addition, the fine trim ladder 12 includes a plurality of fine ladder resistors connected in series between a first conductor and a second conductor, including a plurality of fine ladder resistors $R_{1F}$-$R_{4F}$. In between the coarse trim ladder 11 and fine trim ladder 12, a first plurality of switches (e.g., $S1_A$, $S2_A$, $S1_B$, $S3_A$, $S2_B$, $S4_A$, $S3_B$, $S4_B$, etc.) are arranged and controlled to selectively connect one or more of the coarse ladder resistors $R_{1C}$-$R_{4C}$ between the first and second conductors. In addition, a second plurality of switches (e.g., S5, S6, S7, S8, S9, etc.) is connected between the fine trim ladder 12 and a reference voltage output node Vref to selectively connect the first and second conductors across one or more of the fine ladder resistors $R_{1F}$-$R_{4F}$ to the reference voltage output node Vref. In operation, one or more coarse bits can be used to control the first plurality of switches so that a first voltage on the coarse trim ladder (e.g., across first coarse ladder resistor $R_{1C}$) is connected by closing only switches $S1_A$, $S1_B$, thereby connecting the first voltage across the complete fine trim ladder 12. In turn, fine control bits are applied to the second plurality of switches so that the fine trim ladder 12 connects a portion of the first voltage to the reference voltage output Vref. While the depicted dual resistor ladder DAC 10 shows only five switches for the trim code in the fine trim ladder 12, it will be appreciated that a 7-bit trim code for the fine trim ladder will require 128 switches so that the fine trim ladder 12 can select one out of 128 steps.

To provide additional details for an improved understanding of a dual resistor ladder DAC circuit used to generate an output reference voltage, reference is now made to FIG. 2 which shows a simplified block diagram 20 of a voltage reference trim decoder 22 which is connected to receive and decode a voltage reference trim code 21 when generating switch controls 23-24 for dual resistor ladder DAC having a coarse trim ladder and fine trim ladder. In the depicted example, the voltage reference trim code 21 is arranged as a 12-bit trim code signal (VREF_TRIM[11:0]) which includes a plurality of fine trim bits $b_0$-$b_6$ and a plurality of coarse trim bits $b_7$-$b_{11}$. At the voltage reference trim decoder 22, the 12-bit trim code signal is decoded into a first plurality of coarse trim bits $b_7$-$b_{11}$ 23 (that are provided to the coarse ladder switches) and a second plurality of fine trim bits $b_0$-$b_6$ 24 (that are provided to the fine ladder switches).

In an example embodiment where the dual resistor ladder DAC 10 is connected to a supply voltage Vddd=0.8V, a 12-bit trim code signal VREF_TRIM[11:0] provided to the dual resistor ladder DAC may generate a the reference voltage Vref output having a specified trim range of Vref=150 mV to 500 mV. To this end, the resistance values for the plurality of coarse ladder resistors $R_{1C}$-$R_{4C}$ are set to provide a uniform coarse voltage step across each coarse ladder resistor of 13 mV, and the resistance values for the plurality of fine ladder resistors $R_{1F}$-$R_{4F}$ are set to provide a uniform fine voltage step across each fine ladder resistor of 90 μV. With five coarse trim bits $b_7$-$b_{11}$, the coarse trim ladder switches may be controlled to provide $2_5$=32 different switch signals to the switches connecting the coarse trim ladder 11 to the fine trim ladder 12. In similar fashion, seven fine trim bits $b_0$-$b_6$ can be used to provide $2_7$=128 different switch signals to control the switches connecting the fine trim ladder 12 to the reference voltage output Vref. Thus, a 12-bit trim code signal VREF_TRIM[11:0]=0x000 can be decoded to generate an output reference voltage at the lower end of the specified trim range (e.g., 150 mV), and the 12-bit trim code signal VREF_TRIM[11:0]=0xFFF can be decoded to generate an output reference voltage at the upper end of the specified trim range (e.g., 500 mV), with intervening voltage intervals of 90 μV being specified by increments to the 12-bit trim code signal VREF_TRIM.

Ideally, the fine step temperature variation would be approximately 40 μV with a larger current (e.g., 90 nA) in the coarse trim ladder 11 and a much smaller current (e.g., 700 pA) in the fine trim ladder 12. However, existing dual resistor ladder DAC configurations typically introduce leakage diodes into the substrate by virtue of the connection of the switching transistors used. For example, when the switching transistors (e.g., S5, S6, S7, S8, S9, etc.) connecting the fine trim ladder 12 to the reference voltage output Vref are formed with NMOS switches that have their gates controlled by a 1.5V supply voltage, a significant diode leakage occurs when the bulk semiconductor substrate of the NMOS switches are connected to ground. This diode leakage causes the reference voltage output Vref to vary with temperature, which adds to the variation in the output frequency.

One possible solution for eliminating the leakage diode would be to short the bulk semiconductor and source terminals of each fine trim NMOS switches (e.g., S5-S9). However, this solution imposes a significant circuit area cost since it requires additional isolated p-well for each fine trim NMOS switch. Another problem with this solution is that a diode is formed between the shorted source/bulk node and the underlying substrate in the post extraction which creates leakage, thereby increasing the temperature variation. Given the small voltage drop (e.g., 13 mV) across the fine trim ladder, the leakage diode solution would include directly connecting the reference voltage output Vref to the bulk semiconductor layer. While this has the advantage of requiring a smaller circuit area (since only a single deep n-well region is required for the fine trim NMOS switching devices), this solution creates a larger diode between the reference voltage output Vref and the deep n-well, resulting in more temperature leakage. In particular, temperature variation of the fine trim ladder is 324 µV across the process and voltage, with a mean of 240 µV across Monte Carlo simulations.

Figure 3:
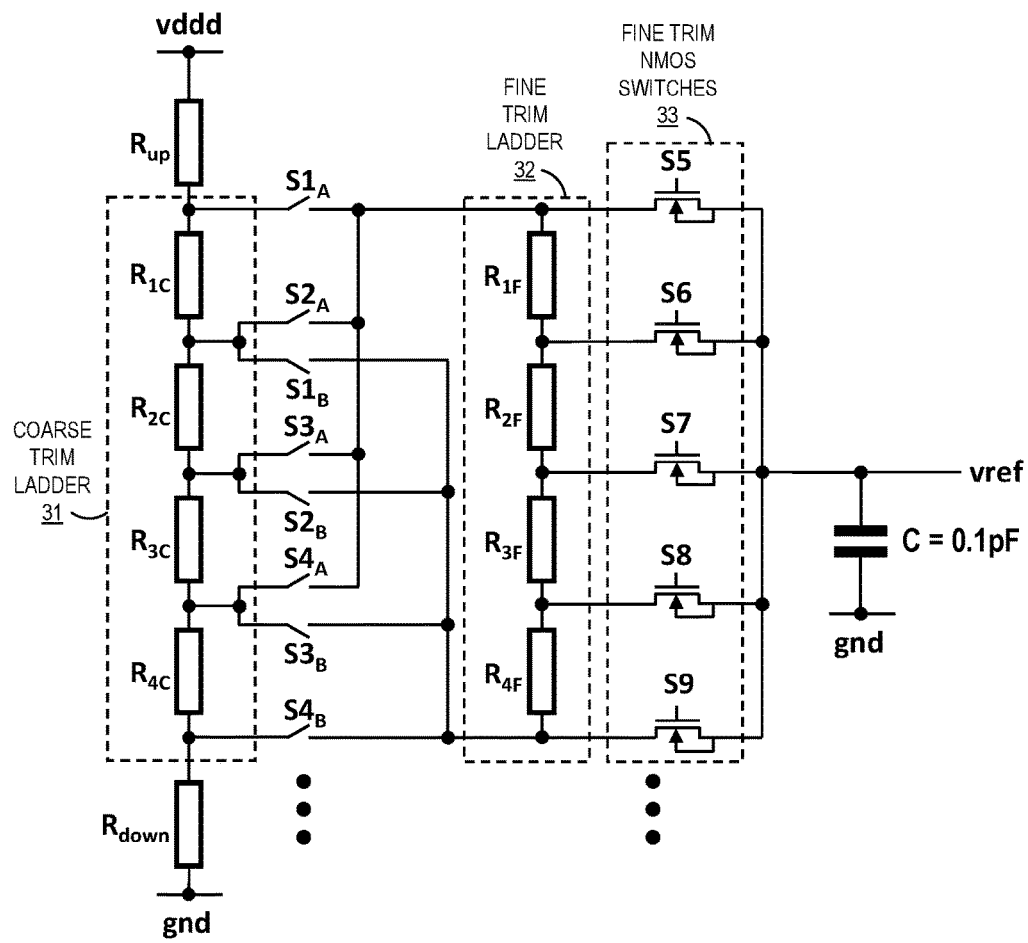
FIG. 3 is a schematic circuit diagram of a dual resistor RDAC ladder wherein the reference voltage output Vref is connected directly to the bulk substrate.

To illustrate a conventional solution to the introduction of the diode leakage with existing dual resistor ladder DAC configurations, reference is now made to FIG. 3 which depicts a schematic circuit diagram of a dual resistor ladder DAC 30 which includes a coarse trim ladder 31 and fine trim ladder 32 connected with a plurality of switches to receive an input supply voltage Vddd and to generate an output reference voltage Vref across an output capacitor C that is connected to ground. Similar to the configuration depicted in FIG. 1, the coarse trim ladder 31 (e.g., $R_{UP}$, $R_{1C}$-$R_{4C}$, $R_{DOWN}$) is connected to the fine trim ladder 32 (e.g., $R_{1F}$-$R_{4F}$) with a first plurality of switches (e.g., $S1_A$, $S2_A$, $S1_B$, $S3_A$, $S2_B$, $S4_A$, $S3_B$, $S4_B$, etc.) that are arranged and controlled to selectively connect one or more of the coarse ladder resistors (e.g., $R_{1C}$-$R_{4C}$) between the first and second conductors. In addition, the depicted second plurality of switches 33 are implemented as fine trim NMOS switches devices (e.g., S5-S9, etc.) which are connected between the fine trim ladder 32 and the reference voltage output node Vref which is also directly connected to the bulk of the fine trim NMOS switches 33. Unfortunately, when the underlying semiconductor substrate of the fine trim NMOS switches 33 is connected to ground, a diode is created in the device substrate which creates leakage from the supply voltage Vddd to the output reference voltage Vref or vice versa, thereby causing the reference voltage output Vref to vary with temperature.

Figure 4A:
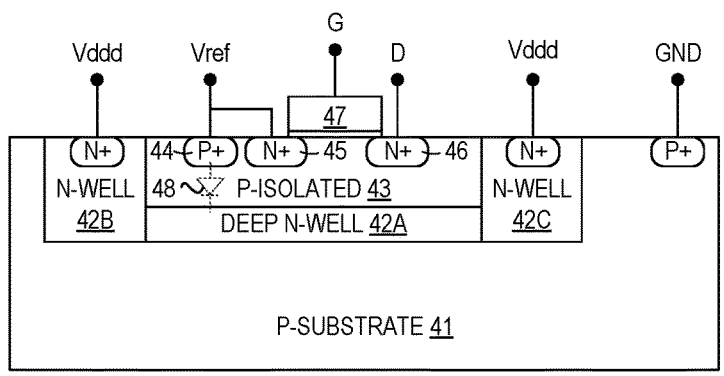
FIG. 4A is a simplified cross-sectional view of a fine trim ladder NFET switch having the bulk connected to the reference voltage Vref in accordance with the example depicted in FIG. 3.
Figure 4B:
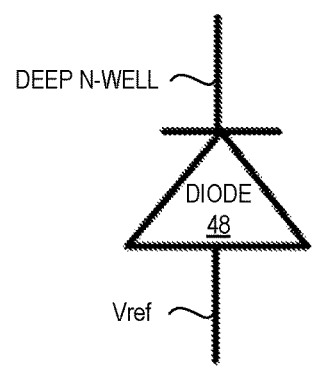
FIG. 4B is a simplified circuit diagram of the diode formed between the reference voltage output Vref and the deep n-well in accordance with the example depicted in FIG. 3.

To illustrate the disadvantage of conventional solutions for addressing the diode leakage with existing dual resistor ladder DAC configurations, reference is now made to FIG. 4A which depicts a simplified cross-sectional view 40 of a fine trim ladder NFET switch 41-48 having the isolated p-type bulk semiconductor layer 43 connected to the reference voltage output Vref in accordance with the example depicted in FIG. 3. In addition, reference made to FIG. 4B which depicts a simplified circuit diagram 49 of the diode 48 formed between the reference voltage output Vref and the deep n-well in accordance with the example depicted in FIG. 3. As depicted in FIG. 4A, the fine trim ladder NFET switch 41-48 is formed in a p-type substrate layer 41 which is connected to ground via a P+ contact. In the p-type substrate layer 41, a deep n-well ring layer 42A is formed and connected via n-well regions 42B-C to an N+ contact for the supply voltage Vddd. Within the deep n-well ring layer 42A and n-well 42B-C, an isolated p-type bulk semiconductor layer 43 is surrounded and protected from the underlying p-type substrate layer 41, and includes a P+ contact 44 that connects the reference voltage output Vref to the isolated p-type bulk layer 43. In addition, N+ source region 45 and drain region 46 are formed in the isolated p-type bulk semiconductor layer 43 to define a channel region below the gate electrode structure 47. With the deep n-well ring layer 42 connected to the supply voltage Vddd and with the reference voltage output Vref connected to the isolated p-type bulk semiconductor layer 43, a diode 48 is formed between the reference voltage output Vref and the deep n-well ring layer 42 which contributes to diode leakage.

To address these shortcomings from conventional solutions and others known to those skilled in the art, there is disclosed herein a low current, adaptively-biased switched resistor digital-to-analog converter (RDAC) circuit, apparatus, and method of operation which provides a mechanism to enhance temperature stability without requiring any offset or any additional deep n-well rings. In selected embodiments, the low current, adaptively-biased, switched RDAC circuit is implemented by driving the bulk of all fine trim NMOS switches with a unity gain buffer that is connected in feedback to receive the output reference voltage, thereby providing a low current, low circuit area solution with reduced leakage current and temperature variation.

Figure 5:
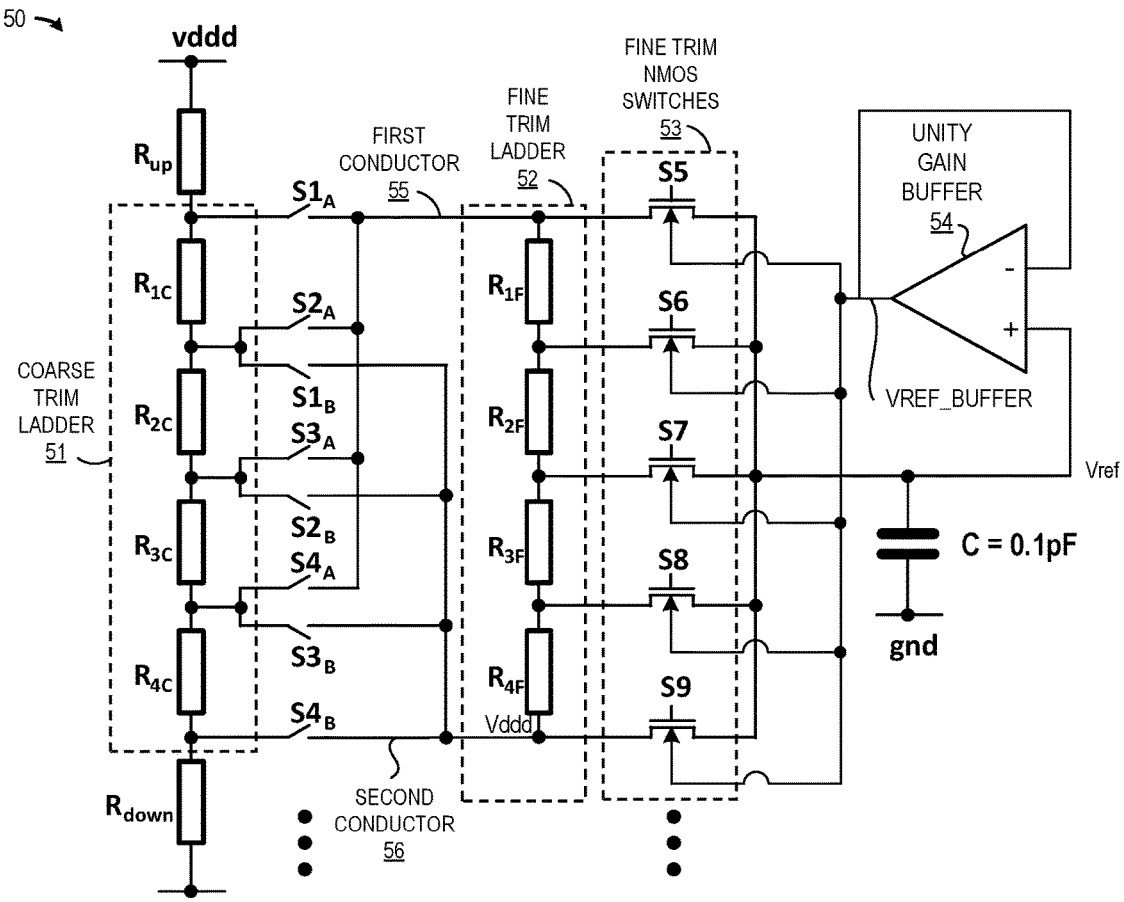
FIG. 5 is a schematic circuit diagram of an RDAC ladder wherein the reference voltage output Vref is connected to a unity gain buffer for driving the bulk substrate to reduce diode leakage in accordance with selected embodiments of the present disclosure.

To illustrate selected embodiments of the disclosed low current, adaptively-biased, switched RDAC circuit, reference is now made to FIG. 5 which depicts a schematic circuit diagram of an RDAC ladder 50 wherein the reference voltage output Vref is connected to a unity gain buffer 54 for driving the bulk of the fine trim NMOS switches 53 to reduce diode leakage in accordance with selected embodiments of the present disclosure. As depicted, the RDAC ladder 50 includes a coarse trim ladder 51 and fine trim ladder 52 connected with a plurality of switches to receive an input supply voltage Vddd and to generate an output reference voltage Vref across an output capacitor C that is connected to ground. Similar to the configuration depicted in FIG. 1, the coarse trim ladder 51 (e.g., $R_{UP}$, $R_{1C}$-$R_{4C}$, $R_{DOWN}$) is connected to the fine trim ladder 52 (e.g., $R_{1F}$-$R_{4F}$) with a first plurality of switches (e.g., $S1_A$, $S2_A$, $S1_B$, $S3_A$, $S2_B$, $S4_A$, $S3_B$, $S4_B$, etc.) that are arranged and controlled to selectively connect one or more of the coarse ladder resistors (e.g., $R_{1C}$-$R_{4C}$) between the first and second conductors 55, 56. In addition, the depicted second plurality of switches 53 are implemented as fine trim NMOS switches devices (e.g., S5-S9, etc.) which are connected between the fine trim ladder 52 and the reference voltage output node Vref. However, instead of directly connecting the reference voltage output Vref to the bulk of the fine trim NMOS switches 53, the unity gain buffer 54 is connected and configured in a feedback arrangement to receive the reference voltage output Vref and to drive the bulk of all fine trim NMOS switches 53 with the output VREF_BUFFER from the unity gain amplifier 54. As depicted, the unity gain amplifier 54 includes a non-inverting input that is connected to receive the reference voltage output Vref, and also includes an inverting input that is connected to the output of the unity gain amplifier 54 which also drives the bulk of the fine trim NMOS switches devices (e.g., S5-S9). As a result, the leakage current in the diode formed between bulk connection and deep n-well will be supplied by the output VREF_BUFFER from the unity gain buffer 54 instead of being supplied directly by the reference voltage output Vref.

Figure 6A:
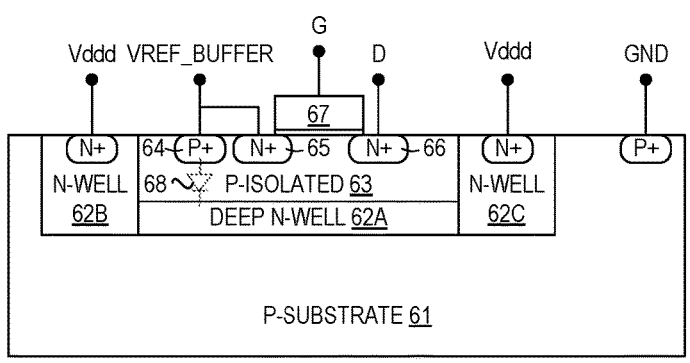
FIG. 6A is a simplified cross-sectional view of a fine trim ladder NFET switch having the bulk connected to the output of a unity gain buffer which receives the reference voltage Vref as an input in accordance with selected embodiments of the present disclosure.
Figure 6B:
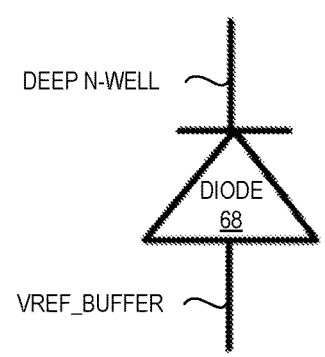
FIG. 6B is a simplified circuit diagram of the diode formed between the bulk connection and the substrate in accordance with selected embodiments of the present disclosure.

To provide additional details for an improved understanding of the advantages of the disclosed low current, adaptively-biased, switched RDAC circuit, reference is now made to FIG. 6A which depicts a simplified cross-sectional view 60 of a fine trim ladder NFET switch 61-68 having the isolated p-type bulk semiconductor layer 63 connected to the output VREF_BUFFER from the unity gain buffer 54 in accordance with the example depicted in FIG. 5. In addition, reference made to FIG. 6B which depicts a simplified circuit diagram 69 of the diode 68 formed between the unity gain buffer output VREF_BUFFER and the deep n-well 62 in accordance with the example depicted in FIG. 5. As depicted in FIG. 6A, the fine trim ladder NFET switch 61-68 is formed in a p-type substrate layer 61 which is connected to the ground via a P+ contact. In the p-type substrate layer 61, a deep n-well ring layer 62A is connected via n-well regions 62B-C to an N+ contact for the supply voltage Vddd. Within the deep n-well ring layer 62A and n-well 62B-C, an isolated p-type bulk semiconductor layer 63 is surrounded and protected from the bulk p-type substrate 61, and includes a P+ contact 64 that connects the unity gain buffer output VREF_BUFFER to the isolated p-type bulk layer 63. In addition, N+ source region 65 and drain region 66 are formed in the isolated p-type bulk semiconductor layer 63 to define a channel region below the gate electrode structure 67. With the deep n-well ring layer 62 connected to the supply voltage Vddd and with the unity gain buffer output VREF_BUFFER connected to the isolated p-type bulk semiconductor layer 63, FIG. 6B shows that the leakage current in the diode 68 formed between bulk connection and deep n-well will be supplied by the output VREF_BUFFER from the unity gain buffer 54 instead of being supplied directly by the reference voltage output Vref. Thus, even though the resulting diode 68 formed between the unity gain buffer output VREF_BUFFER and the deep n-well ring layer 62 is the same size, the fact that it is supplied by the unity gain buffer output VREF_BUFFER means that it will not contribute leakage that causes temperature variation in the reference voltage output Vref.

Figure 7:
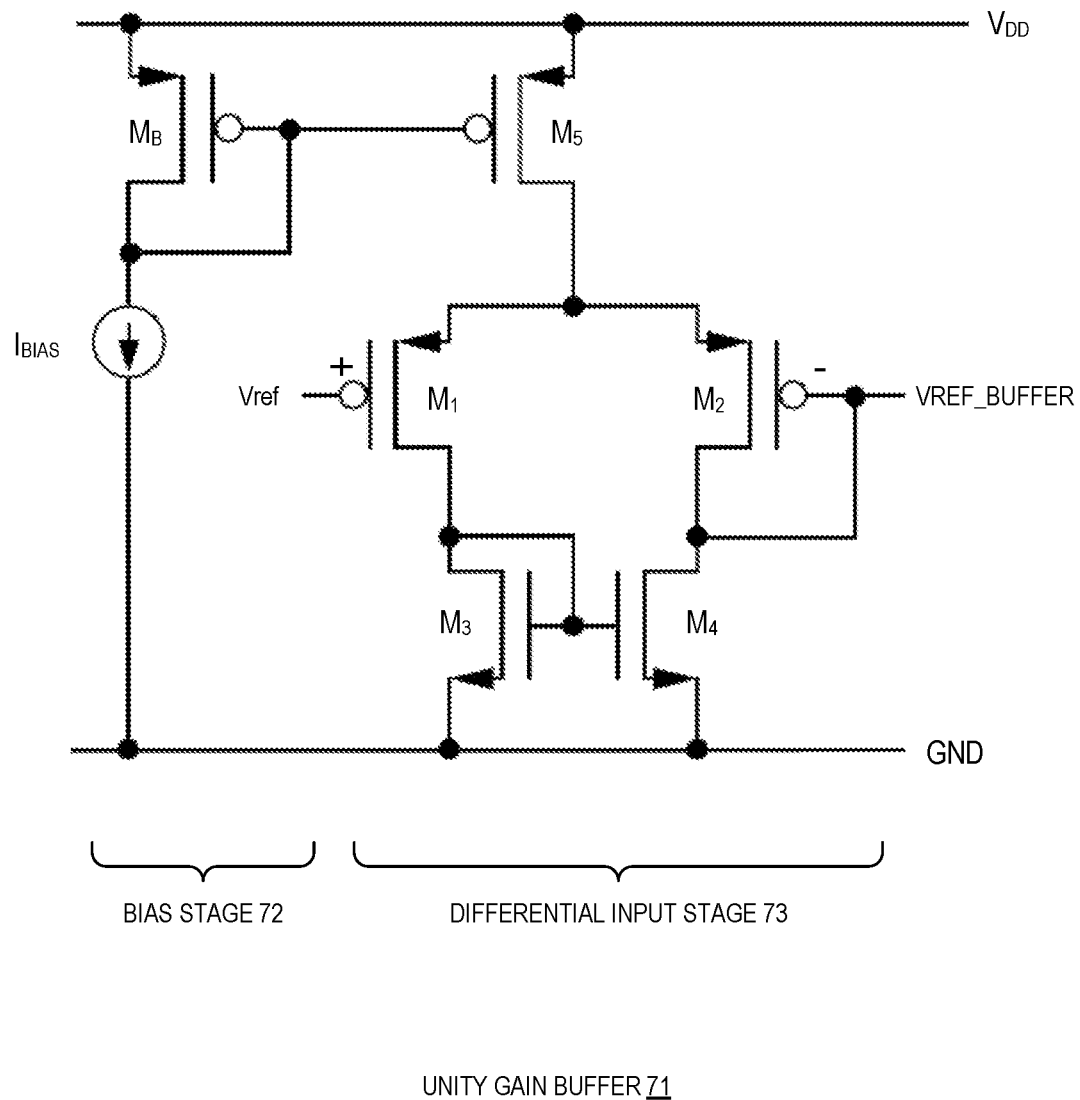
FIG. 7 is a simplified circuit diagram of a unity gain buffer in accordance with selected embodiments of the present disclosure.

As disclosed herein, the unity gain buffer may employ any suitable design with no high gain or bandwidth requirements. To provide additional details for an improved understanding of selected embodiments of the disclosed low current, adaptively-biased, switched RDAC circuit, reference is now made to FIG. 7 which depicts a simplified circuit diagram 70 of a unity gain buffer 71 which employs a simple 5-transistor design. The topology of the unity gain buffer circuit 71 is a CMOS op-amp which includes bias circuit 72 and a differential input gain stage 73, though one or more additional input or output circuits or stages may be included. In the depicted bias circuit 72, the PMOS transistor MB and reference current source $I_{BIAS}$ form a simple current mirror biasing network that provide a voltage to the differential input gain stage 73 between the gate and source of the PMOS transistor M5. In this way, the PMOS transistor M5 sinks a current based on its gate to source voltage which is controlled by the bias network. In the differential input stage 73, the PMOS transistors M1, M2 and NMOS transistors M3 and M4 are connected to form an op-amp differential amplifier which generates an output signal VREF_BUFFER in response to differential input signals Vref and VREF_BUFFER. In particular, the transistors M1-M4 of the differential input stage 73 generate an output signal VREF_BUFFER which is fed back as a first inverted input signal to the differential input stage 73 which is also connected to receive the input signal VREF which as a non-inverted input signal. In particular, the gate of PMOS transistor M1 is the non-inverting input and the gate of PMOS transistor M2 is the inverting input. As a result, a differential input signal applied across the two input terminals will be amplified according to the gain of the differential stage which equals the transconductance of PMOS transistor M1 times the total output resistance seen at the drain of PMOS transistor M2. The depicted differential input stage 73 also includes NMOS transistors M3, M4 connected as a current mirror which performs the differential-to-single-ended conversion of the input signal.

As seen from the foregoing, the disclosed low current, adaptively-biased, switched RDAC circuit solves the temperature variation problem by connecting the unity gain buffer to the bulk of all fine trim NMOS switches to effectively eliminate the diode leakage current without increasing the circuit area or power consumption. As a result, any the leakage current in the diode between bulk connection and deep n-well will be supplied by the unity gain buffer instead of the reference voltage output Vref. With a simple 5-transistor design, the unity gain buffer consumes very little current (e.g., only 200 nA), and there is no offset requirement, as the voltage drop of 10-15 mV across the diode will not impact the leakage. As a result, the temperature variation for the fine trim NMOS switches is 44 uV across the process and voltage, with a mean temperature variation of 33 uV across Monte Carlo.

By now, it should be appreciated that there has been provided herein a digital-to-analog converter (DAC) circuit, method, and system for generating an output reference voltage Vref at an output node. As disclosed, the DAC includes a coarse trim ladder which includes a first linear sequence of series-connected coarse ladder resistive devices coupled between first and second power supply voltages. In selected embodiments, the coarse trim ladder is connected over a first resistor to the first power supply and is connected over a second resistor to the second power supply, and also includes a plurality of coarse ladder nodes connected, respectively, between the series-connected coarse ladder resistive devices. The disclosed DAC also includes a fine trim ladder which includes a second linear sequence of series-connected fine ladder resistive devices connected between a first conductor and a second conductor. In addition, the disclosed DAC includes a first plurality of metal-oxide-semiconductor field-effect transistors (MOSFET) switches arranged and controlled to selectively connect one or more of the coarse ladder resistive devices between the first and second conductors. In selected embodiments, each of the first plurality of MOSFET switches includes a drain terminal connected to a corresponding coarse ladder node, a source terminal connected to either the first or second conductor, and a gate terminal controlled by a coarse trim gating signal decoded from a multi-bit voltage trim code. The disclosed DAC also includes a second plurality of fine trim N-type MOSFET switches arranged and controlled to selectively connect the first and second conductors across one or more of the fine ladder resistive devices to generate an output reference voltage Vref at an output node. In selected embodiments, each of the second plurality of fine trim N-type MOSFET switches includes a drain terminal connected to a corresponding fine ladder node, a source terminal connected to the output node, and a gate terminal controlled by a fine trim gating signal decoded from a multi-bit voltage trim code. In other selected embodiments, the fine trim ladder is connected between the coarse trim ladder and the second plurality of fine trim N-type MOSFET switches, and includes a plurality of fine ladder nodes connected, respectively, between the series-connected fine ladder resistive devices. In addition, the disclosed DAC includes a unity gain buffer connected in feedback to receive the output reference voltage Vref and to generate a buffered reference voltage which is directly connected to bulk semiconductor regions of the second plurality of fine trim N-type MOSFET switches. In selected embodiments, the fine trim ladder is connected between the coarse trim ladder and the second plurality of fine trim N-type MOSFET switches, and includes a plurality of fine ladder nodes connected, respectively, between the series-connected fine ladder resistive devices. In selected embodiments, the unity gain buffer is embodied with a complementary MOS operational amplifier having a bias circuit and a differential input gain stage which includes a non-inverting input that is connected to receive the output reference voltage Vref, and which also includes an inverting input that is connected to receive the buffered reference voltage so that the unity gain amplifier drives the bulk semiconductor regions of the second plurality of fine trim N-type MOSFET switches. In selected embodiments, only a single deep n-well ring is formed to surround the bulk semiconductor regions of the second plurality of fine trim N-type MOSFET switches. In other selected embodiments, the DAC output reference voltage Vref generated by the DAC has a fine step temperature variation of approximately 40-44 µV over a specified temperature range of approximately −40° F. to 150° F.

In another form, there is provided a resistor digital-to-analog converter (RDAC) ladder circuit, method, and system with adaptive body biasing. As disclosed, the RDAC ladder includes a coarse trim ladder and a fine trim ladder connected in parallel with a plurality of FET switches to generate an output reference voltage from first and second supply voltages. In selected embodiments, the plurality of FET switches is embodied as a plurality of N-type MOSFET switches or a plurality of P-type MOSFET switches. In other selected embodiments, each of the plurality of FET switches includes a drain terminal connected to a corresponding fine ladder node in the fine trim ladder, a source terminal connected to an output node, and a gate terminal controlled by a fine trim gating signal decoded from a multi-bit voltage trim code. In selected embodiments, the coarse trim ladder includes a first linear sequence of series-connected coarse ladder resistive devices coupled between the first and second supply voltages, the fine trim ladder includes a second linear sequence of series-connected fine ladder resistive devices connected between a first conductor and a second conductor, and the plurality of FET switches comprises a plurality of fine trim N-type MOSFET switches arranged and controlled to selectively connect the first and second conductors across one or more of the fine ladder resistive devices to generate the output reference voltage at an output node. As disclosed, the plurality of FET switches includes a plurality of bulk semiconductor substrate regions driven by a unity gain buffer which is connected in feedback to receive the output reference voltage, thereby providing a low current, reduced leakage current dual resistor ladder digital-to-analog converter circuit without temperature variation in the output reference voltage. In selected embodiments, the unity gain buffer is connected to receive the output reference voltage and to generate a buffered reference voltage which is directly connected to bulk semiconductor substrate regions of the plurality of FET switches. In other selected embodiments, the disclosed unity gain buffer includes a complementary MOSFET (CMOS) operational amplifier for generating a buffered reference voltage, where the CMOS operational amplifier includes a bias circuit and a differential input gain stage which includes a non-inverting input (connected to receive the output reference voltage), and an inverting input (connected to receive the buffered reference voltage) so that the unity gain amplifier drives the bulk semiconductor substrate regions of the plurality of MOSFET switches. In selected embodiments, only a single deep n-well ring is formed to surround the bulk semiconductor substrate regions of the plurality of MOSFET switches without additional isolated p-wells being formed in the substrate. In other selected embodiments, the output reference voltage generated by the RDAC ladder has a fine step temperature variation of approximately 40-44 µV over a specified temperature range of approximately −40° F. to 150° F.

In yet another form, there is provided a dual resistor ladder digital-to-analog converter circuit. As disclosed, the dual RDAC circuit includes a coarse trim ladder and a fine trim ladder connected with a plurality of FET switches to generate an output reference voltage from an input supply voltage, where the plurality of FET switches include a plurality of bulk semiconductor substrate regions driven by a unity gain buffer which is connected in feedback to receive the output reference voltage, thereby providing a low current, reduced leakage current dual resistor ladder digital-to-analog converter circuit with substantially no temperature variation in the output reference voltage. In selected embodiments, the coarse trim ladder includes a first linear sequence of series-connected coarse ladder resistive devices coupled between first and second supply voltages, the fine trim ladder includes a second linear sequence of series-connected fine ladder resistive devices connected between a first conductor and a second conductor, and the plurality of FET switches includes a plurality of fine trim N-type MOSFET switches arranged and controlled to selectively connect the first and second conductors across one or more of the fine ladder resistive devices to generate the output reference voltage at an output node. In other embodiments, the plurality of FET switches are embodied as a plurality of N-type MOSFET switches. In other selected embodiments, the unity gain buffer is connected to receive the output reference voltage and to generate a buffered reference voltage which is directly connected to bulk semiconductor substrate regions of the plurality of FET switches. In yet other embodiments, the output reference voltage generated by the dual resistor ladder digital-to-analog converter circuit has a fine step temperature variation of approximately 40-44 µV over a specified temperature range of approximately −40° F. to 150° F.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A digital-to-analog converter, comprising:
a coarse trim ladder comprising a first linear sequence of series-connected coarse ladder resistive devices coupled between first and second power supply voltages;
a fine trim ladder comprising a second linear sequence of series-connected fine ladder resistive devices connected between a first conductor and a second conductor;
a first plurality of metal-oxide-semiconductor field-effect transistors (MOSFET) switches arranged and controlled to selectively connect one or more of the coarse ladder resistive devices between the first and second conductors;
a second plurality of fine trim N-type MOSFET switches arranged and controlled to selectively connect the first and second conductors across one or more of the fine ladder resistive devices to generate an output reference voltage Vref at an output node; and
a unity gain buffer connected in feedback to receive the output reference voltage Vref and to generate a buffered reference voltage which is directly connected to bulk semiconductor regions of the second plurality of fine trim N-type MOSFET switches, where only a single deep n-well ring is formed to surround the bulk semiconductor regions of the second plurality of fine trim N-type MOSFET switches.

2. The digital-to-analog converter of claim 1, where the coarse trim ladder is connected over a first resistor to the first power supply and is connected over a second resistor to the second power supply, where the coarse trim ladder comprises a plurality of coarse ladder nodes connected, respectively, between the series-connected coarse ladder resistive devices.

3. The digital-to-analog converter of claim 2, where each of the first plurality of MOSFET switches comprises a drain terminal connected to a corresponding coarse ladder node, a source terminal connected to either the first or second conductor, and a gate terminal controlled by a coarse trim gating signal decoded from a multi-bit voltage trim code.

4. The digital-to-analog converter of claim 1, where the fine trim ladder is connected between the coarse trim ladder and the second plurality of fine trim N-type MOSFET switches, where the fine trim ladder comprises a plurality of fine ladder nodes connected, respectively, between the series-connected fine ladder resistive devices.

5. The digital-to-analog converter of claim 4, where each of the second plurality of fine trim N-type MOSFET switches comprises a drain terminal connected to a corresponding fine ladder node, a source terminal connected to the output node, and a gate terminal controlled by a fine trim gating signal decoded from a multi-bit voltage trim code.

6. A digital-to-analog converter, comprising:
a coarse trim ladder comprising a first linear sequence of series-connected coarse ladder resistive devices coupled between first and second power supply voltages;
a fine trim ladder comprising a second linear sequence of series-connected fine ladder resistive devices connected between a first conductor and a second conductor;
a first plurality of metal-oxide-semiconductor field-effect transistors (MOSFET) switches arranged and controlled to selectively connect one or more of the coarse ladder resistive devices between the first and second conductors;
a second plurality of fine trim N-type MOSFET switches arranged and controlled to selectively connect the first and second conductors across one or more of the fine ladder resistive devices to generate an output reference voltage Vref at an output node; and
a unity gain buffer connected in feedback to receive the output reference voltage Vref and to generate a buffered reference voltage which is directly connected to bulk semiconductor regions of the second plurality of fine trim N-type MOSFET switches,
where the unity gain buffer comprises a complementary MOS operational amplifier which includes a bias circuit and a differential input gain stage which includes a non-inverting input that is connected to receive the output reference voltage Vref, and also includes an inverting input that is connected to receive the buffered reference voltage so that the unity gain amplifier drives the bulk semiconductor regions of the second plurality of fine trim N-type MOSFET switches.

7. A digital-to-analog converter, comprising:
a coarse trim ladder comprising a first linear sequence of series-connected coarse ladder resistive devices coupled between first and second power supply voltages;
a fine trim ladder comprising a second linear sequence of series-connected fine ladder resistive devices connected between a first conductor and a second conductor;
a first plurality of metal-oxide-semiconductor field-effect transistors (MOSFET) switches arranged and controlled to selectively connect one or more of the coarse ladder resistive devices between the first and second conductors;
a second plurality of fine trim N-type MOSFET switches arranged and controlled to selectively connect the first and second conductors across one or more of the fine ladder resistive devices to generate an output reference voltage Vref at an output node; and
a unity gain buffer connected in feedback to receive the output reference voltage Vref and to generate a buffered reference voltage which is directly connected to bulk semiconductor regions of the second plurality of fine trim N-type MOSFET switches,
where the output reference voltage Vref has a fine step temperature variation of approximately 40-44 µV over a specified temperature range of approximately −40° F. to 150° F.

8. A resistor digital-to-analog converter (RDAC) ladder with adaptive body biasing, comprising:
a coarse trim ladder and a fine trim ladder connected in parallel with a plurality of FET switches to generate an output reference voltage from first and second supply voltages, where the plurality of FET switches comprises a plurality of bulk semiconductor substrate regions driven by a unity gain buffer which is connected in feedback to receive the output reference voltage, thereby providing a low current, reduced leakage current dual resistor ladder digital-to-analog converter circuit without temperature variation in the output reference voltage.

9. The RDAC ladder of claim 8, where the plurality of FET switches comprises a plurality of N-type MOSFET switches.

10. The RDAC ladder of claim 8, where the plurality of FET switches comprises a plurality of P-type MOSFET switches.

11. The RDAC ladder of claim 8, where the coarse trim ladder comprises a first linear sequence of series-connected coarse ladder resistive devices coupled between the first and second supply voltages, where the fine trim ladder comprises a second linear sequence of series-connected fine ladder resistive devices connected between a first conductor and a second conductor, and where the plurality of FET switches comprises a plurality of fine trim N-type MOSFET switches arranged and controlled to selectively connect the first and second conductors across one or more of the fine ladder resistive devices to generate the output reference voltage at an output node.

12. The RDAC ladder of claim 8, where the unity gain buffer is connected to receive the output reference voltage and to generate a buffered reference voltage which is directly connected to bulk semiconductor substrate regions of the plurality of FET switches.

13. The RDAC ladder of claim 8, where each of the plurality of FET switches comprises a drain terminal connected to a corresponding fine ladder node in the fine trim ladder, a source terminal connected to an output node, and a gate terminal controlled by a fine trim gating signal decoded from a multi-bit voltage trim code.

14. The RDAC ladder of claim 8, where the unity gain buffer comprises a complementary MOSFET (CMOS) operational amplifier for generating a buffered reference voltage, where the CMOS operational amplifier comprises a bias circuit and a differential input gain stage which includes a non-inverting input that is connected to receive the output reference voltage, and which also includes an inverting input that is connected to receive the buffered reference voltage so that the unity gain amplifier drives the bulk semiconductor substrate regions of the plurality of MOSFET switches.

15. The RDAC ladder of claim 8, where only a single deep n-well ring is formed to surround the bulk semiconductor substrate regions of the plurality of MOSFET switches without additional isolated p-wells being formed in the substrate.

16. The RDAC ladder of claim 8, where the output reference voltage has a fine step temperature variation of approximately 40-44 µV over a specified temperature range of approximately −40° F. to 150° F.

17. A dual resistor ladder digital-to-analog converter circuit comprising a coarse trim ladder and a fine trim ladder connected with a plurality of FET switches to generate an output reference voltage from an input supply voltage, where the plurality of FET switches comprise a plurality of bulk semiconductor substrate regions driven by a unity gain buffer which is connected in feedback to receive the output reference voltage, thereby providing a low current, reduced leakage current dual resistor ladder digital-to-analog converter circuit with substantially no temperature variation in the output reference voltage.

18. The dual resistor ladder digital-to-analog converter circuit of claim 17, where the plurality of FET switches comprises a plurality of N-type MOSFET switches.

19. The dual resistor ladder digital-to-analog converter circuit of claim 17, where the unity gain buffer is connected to receive the output reference voltage and to generate a buffered reference voltage which is directly connected to bulk semiconductor substrate regions of the plurality of FET switches.

\* \* \* \* \*